United States Patent [19]
Lee et al.

[11] Patent Number: 5,488,248
[45] Date of Patent: Jan. 30, 1996

[54] MEMORY INTEGRATED CIRCUIT

[75] Inventors: Kuo-Hua Lee; Janmye Sung, both of Lower Macungie Township, Lehigh County, Pa.

[73] Assignee: AT&T Corp., Murray Hill, N.J.

[21] Appl. No.: 446,091

[22] Filed: May 19, 1995

Related U.S. Application Data

[63] Continuation of Ser. No. 358,664, Dec. 19, 1994, abandoned, which is a continuation of Ser. No. 178,598, Jan. 7, 1994, abandoned, which is a continuation of Ser. No. 997,152, Dec. 24, 1992, abandoned, which is a continuation of Ser. No. 813,188, Dec. 30, 1991, abandoned.

[51] Int. Cl.[6] ........................ H01L 27/085; H01L 27/11
[52] U.S. Cl. ........................ 257/38.2; 257/393; 257/401; 257/904
[58] Field of Search ........................ 357/23.1, 41, 40; 257/904, 903, 368, 369, 393, 382, 383, 384, 401, 379

[56] References Cited

U.S. PATENT DOCUMENTS

| | | | |
|---|---|---|---|
| 4,212,083 | 7/1980 | Rao | 257/904 |
| 4,982,250 | 1/1991 | Manos, II et al. | 357/235 |
| 5,072,286 | 12/1991 | Minami et al. | 257/903 |

FOREIGN PATENT DOCUMENTS

| | | | |
|---|---|---|---|
| 0190070 | 8/1986 | European Pat. Off. | 357/41 |
| 58-68962 | 4/1983 | Japan | 257/904 |
| 2122522 | 7/1990 | Japan | 257/382 |
| 2049276 | 12/1980 | United Kingdom | 257/382 |

*Primary Examiner*—Donald L. Monin, Jr.
*Attorney, Agent, or Firm*—John T. Rehberg

[57] ABSTRACT

An integrated circuit, illustratively an SRAM, having a low resistance path between an access transistor and a pull down transistor is disclosed. Connection for the cell load to the node between the access transistor and pull down transistor is made outside the defined current path.

3 Claims, 7 Drawing Sheets

MEMORY INTEGRATED CIRCUIT

This application is a continuation of application Ser. No. 08/358,664, filed on Dec. 12, 1994, now abandoned, which is a continuation application under 37 CFR 1.62 of prior application Ser. No. 08/178,598, filed Jan. 7, 1994, now abandoned, which is a continuation application of Ser. No. 07/997,152, filed Dec. 24, 1992, now abandoned, which is a continuation application Ser. No. 07/813,188, filed Dec. 30, 1991, now abandoned.

TECHNICAL FIELD

This invention relates to semiconductor integrated circuits in general and, more particularly, to methods for manufacture of silicon integrated memory circuits.

BACKGROUND OF THE INVENTION

Static semiconductor memories are often referred to as SRAMs (static random access memories) because unlike DRAMs, or dynamic random access memories, they do not require periodic refresh signals to restore their stored data.

The bit state in an SRAM is stored in a pair of cross-coupled inverters which form a circuit termed a "flip-flop." The voltage on each of the two outputs of a flip-flop is stable at only one of two possible voltage levels because the operation of the circuit forces one output to a high potential and the other to a low potential. Flip-flops maintain a given state for as long as the circuit receives power, but they can be made to undergo a change in state (i.e., to flip) upon the application of a trigger voltage of sufficient magnitude and duration to the appropriate input.

FIG. 1 is a circuit diagram indicating a typical SRAM cell. The operation of the SRAM cell depicted in FIG. 1 essentially involves two inverters and behaves as a flip-flop. Transistors having gates 19 and 21 serve as access transistors. For example, when transistor 19 is turned on, a logic 1 appearing at node 17 is transmitted to node 16. Node 16 is connected to the gate of pull down transistor 23. Pull-down transistor 23 begins to conduct, causing a logic low to appear at node 13. The low condition at node 13 turns off pull down transistor 28. Consequently, a logic 1 is observed at node 16 through thin film transistor 27. Thus, interlocked transistors 23 and 28 serve as a latch circuit. Once a logic low (0) or logic high (1) is entered at node 16 or node 13, it remains dynamically amplified by the circuit.

Nodes 13 and 16 which serve to couple access transistor, load transistor, and pull down transistors are particularly important in the fabrication of SRAM cells.

Some designers form nodes 13 and/or 16 in a manner schematically partially depicted in FIG. 8 or FIG. 9. For example, in FIG. 8, reference numeral 25.1 denotes an access transistor gate, while reference numeral 23.1 denotes a pull down transistor gate. Gates 25.1 and 23.1 define a current path through junction 13.1. Window 100.1 is created above the current path through junction 13.1, and is subsequently filled with conductive material which links junction 13.1 to a load.

However, the etching process which opens window 100.1 may inadvertently damage underlying junction 13.1 (which may be silicided). Should the junction (or overlying silicide) be damaged, the resistance of the current path defined by gates 25.1 and 23.1 will be increased and overall cell performance will be degraded.

Another approach for forming a node is shown in FIG. 9. Again, access transistor 25.2 and pull down transistor 23.2 define a current path through L-shaped junction 13.2. Window 100.2 is created in the corner of L-shaped junction 13.2. However, the design of FIG. 9 suffers from the same deficiency as that of FIG. 8, namely, that the window is located above the current path defined by the gates. In other words, in the partially completed structures of FIGS. 8 and 9, current is expected to flow beneath (and upwards through) the window. Should the window etching process somewhat adversely affect the underlying silicide or junction, resistance of the defined current path between the gates is undesirably increased.

SUMMARY OF THE INVENTION

The present invention provides an integrated circuit whose performance is not degraded by overetching. Illustratively, the circuit includes:

a substrate;

two gates overlying the substrate which define a current path; and a dielectric overlying the substrate and gates which have an opening exposing a portion of the substrate which is contiguous to the conductive path. The opening is filled with conductive material. Illustratively, the current path is between the access and pull down transistors, while the opening outside the current path is filled with aluminum which connects to the bit line.

DETAILED DESCRIPTION

Figure 1:
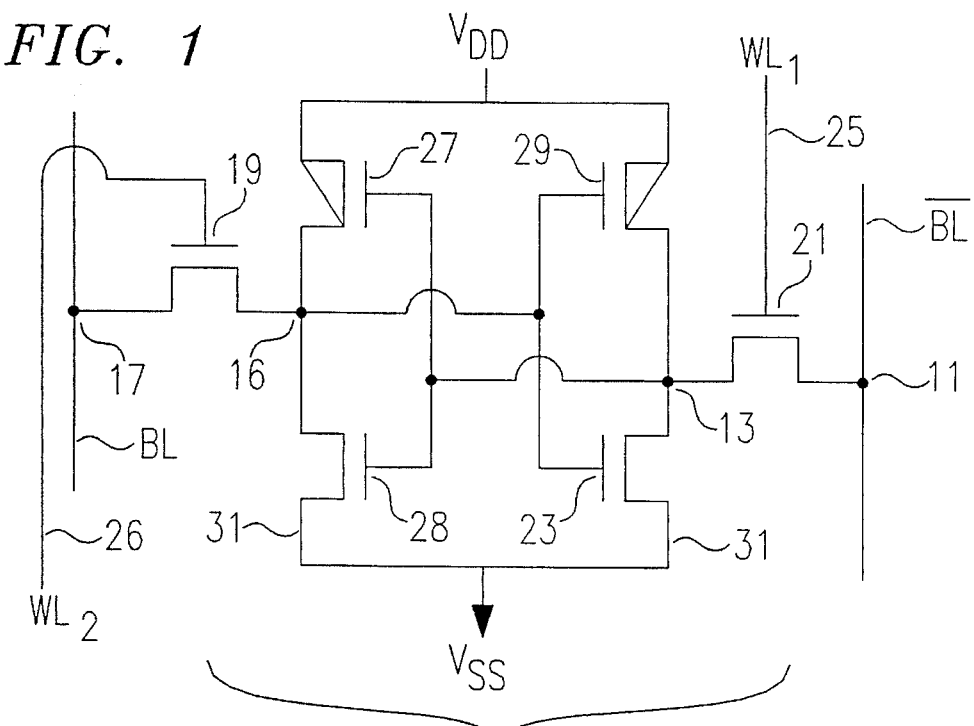
FIG. 1 is a circuit diagram of an SRAM circuit.

Operation of the circuit of FIG. 1 has already been described above.

FIGS. 2–6 illustrate in top down views conventionally used by those skilled in the art how a cell embodying the circuit of FIG. 1 may be implemented. (Those versed in the art will realize that the diagrams of FIGS. 2–6 et seq. omit interlevel dielectrics and gate oxides.) The cells depicted in FIGS. 2–6 are generally drawn to scale.

Figure 7:
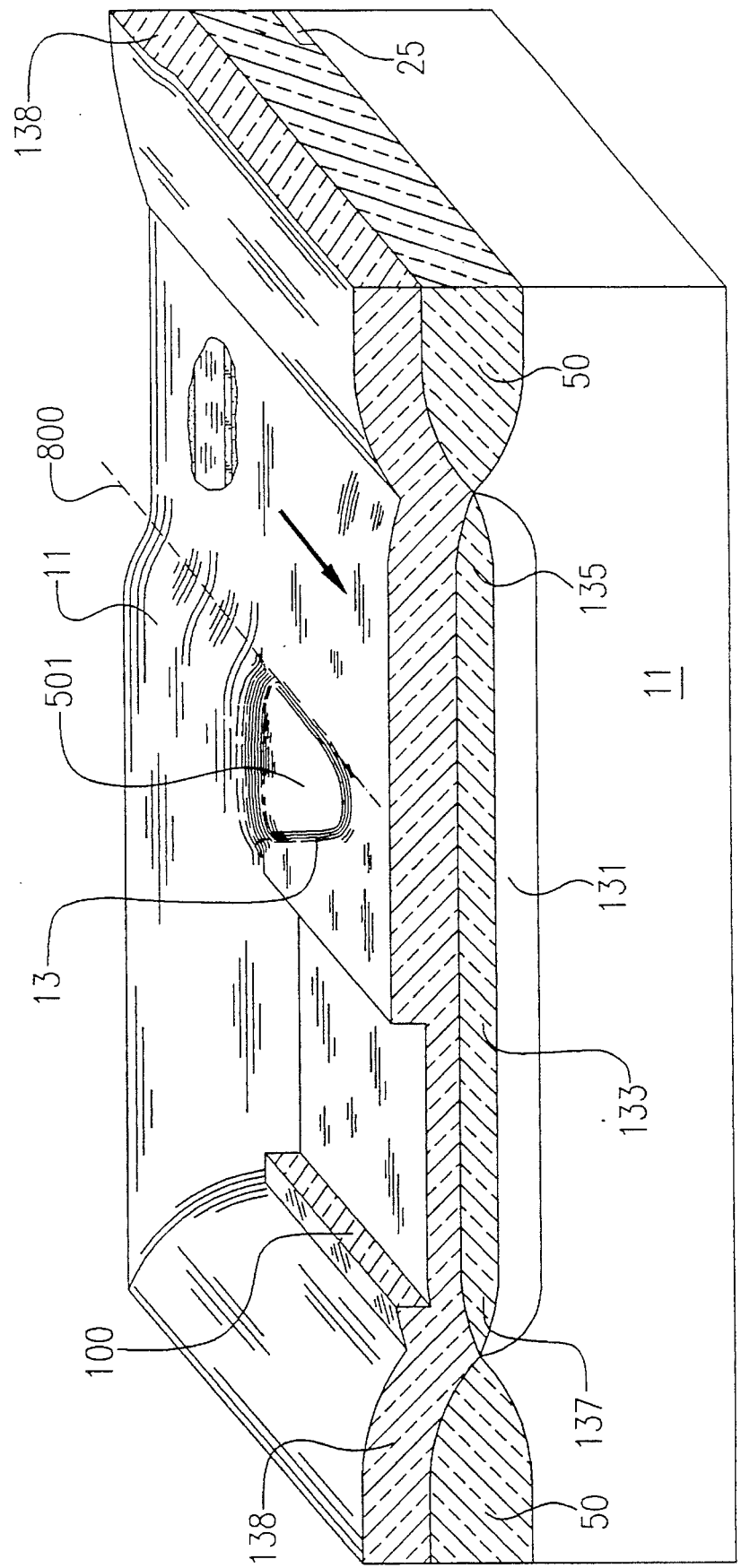
FIG. 7 is a schematic perspective view showing an illustrative embodiment of the present invention.
Figure 8:
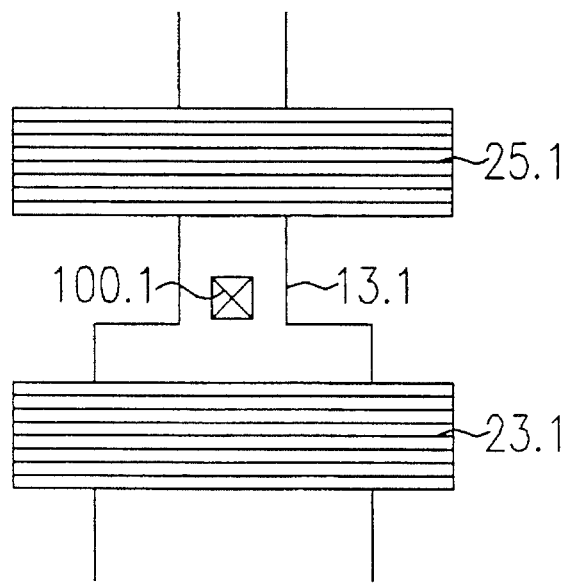
FIGS. 8–9 are diagrams of prior art layouts.
Figure 9:
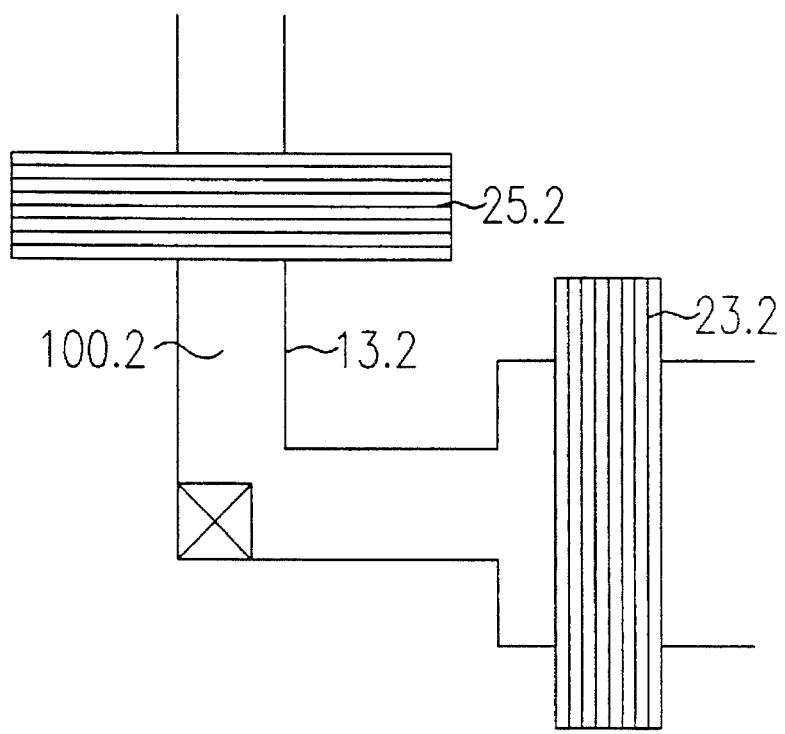

FIG. 7 illustrates in schematic perspective view the junction denoted by reference numeral 13 in FIG. 1. For convenience, various regions in FIGS. 2–7 will be denoted when possible with the same reference numerals as their corresponding circuit elements in FIG. 1. Although FIG. 2 illustrates two identical cells, only one cell will be discussed for convenience.

As is known by those skilled in the art, reference numeral 50 and its contiguous areas denote a field oxide. Reference numeral 51 denotes generally the thin ox regions formed by processes understood by those skilled in the art. Beneath each thin ox region is an appropriate semiconductor junction. Consequently, for simplicity in the discussion which follows, various thin ox regions will be associated with nodes in FIG. 1. Reference numerals 25 and 26 denote two word lines which serve cell 13. Both word lines 25 and 26 may be formed from polysilicon.

Polysilicon stripes 28 and 23 serve as the gates of the pull down transistors of FIG. 1. Thus, it will be noted that FIG. 2 depicts a cell accessed by two separate word lines. The cell is somewhat elongate in the Y direction while being comparatively narrow in the X direction.

Figure 2:
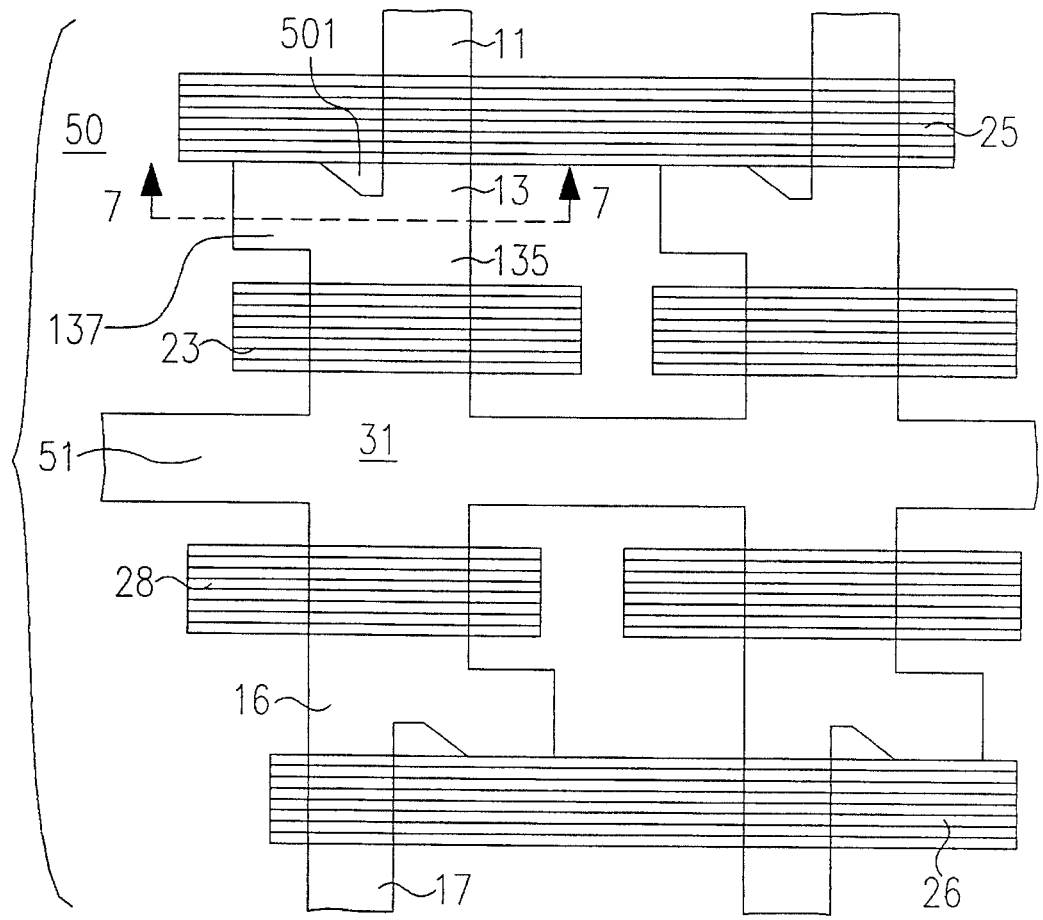
FIGS. 2–6 are diagrams of an SRAM cell layout illustrative of the present invention.
Figure 3:
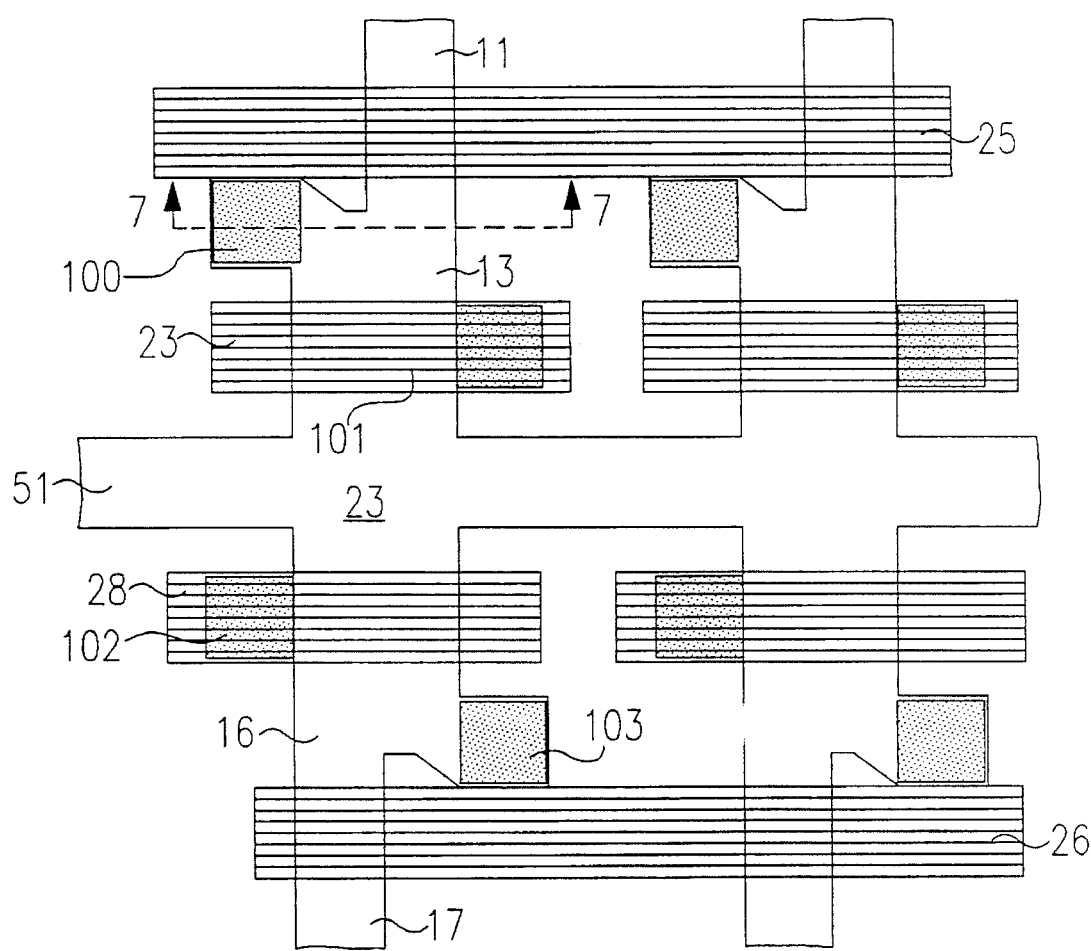

FIG. 3 depicts window openings made through a dielectric 138 covering the circuit of FIG. 2. Openings 100, 101,102, and 103 may be made by conventional etching techniques.

FIG. 7 provides a schematic view of partially-constructed node 13. Shown in FIG. 7 is substrate 11 with junction 131. Typically substrate 11 is silicon, epitaxial silicon, or doped silicon. Junction 131 may be formed by ion implantation. Silicide 133 covers junction 131. Silicide 133 is optional. Also depicted are field oxide 50 and polysilicon word line 25. It is desired to maintain a low resistance path through silicide 133 and junction 131 between polysilicon gate 25 and pull down gate 23 (not shown in FIG. 7). The desired low resistance current path is indicated by the arrow in FIG. 7. However, it is also desired to open a window through dielectric 138 (not shown, per convention in FIGS. 2–6) so that a contact may be made between junction 131 and polysilicon gate 28.

As illustrated in FIG. 7 and 3, opening 100 is etched in dielectric 138 exposing silicide 133 (or junction 133 if no silicide is present). Should the etching process which creates window 100 inadvertently damage silicide 133, the increased resistance of the resulting contact will be seen by the circuit as, effectively, an increased load 29. Thus, a low resistance path (designated by the arrow) between gates 25 and 23 is insured, while, should the etching process inadvertently damage silicide 133, the resulting high resistance merely becomes part of load 29 (or 27).

It will be noted that field oxide protrusion 501 tends to separate junction 13 into two parts. Thus, the presence of field oxide protrusion 501 insures that source and drain regions 11 and 13 (as illustrated in FIG. 2) on both sides of gate 25 have constant width.

It will be noted from an examination of FIG. 2 that region 137 does not extend behind gate 25. Consequently, protrusion 501 effectively divides junction 131 into a current path 135 and a contiguous region in which current does not flow (in the plane of FIG. 2). Reference line 800 effectively demarcates the current path in FIG. 7.

Thus, that portion of silicide 133 denoted by reference numeral 135 is protected against inadvertent damage due to the etching of dielectric 138, while, should that portion of silicide 133 denoted by reference numeral 137 directly beneath opening 100 be inadvertently damaged, performance of the SRAM cell will not be degraded.

Figure 4:
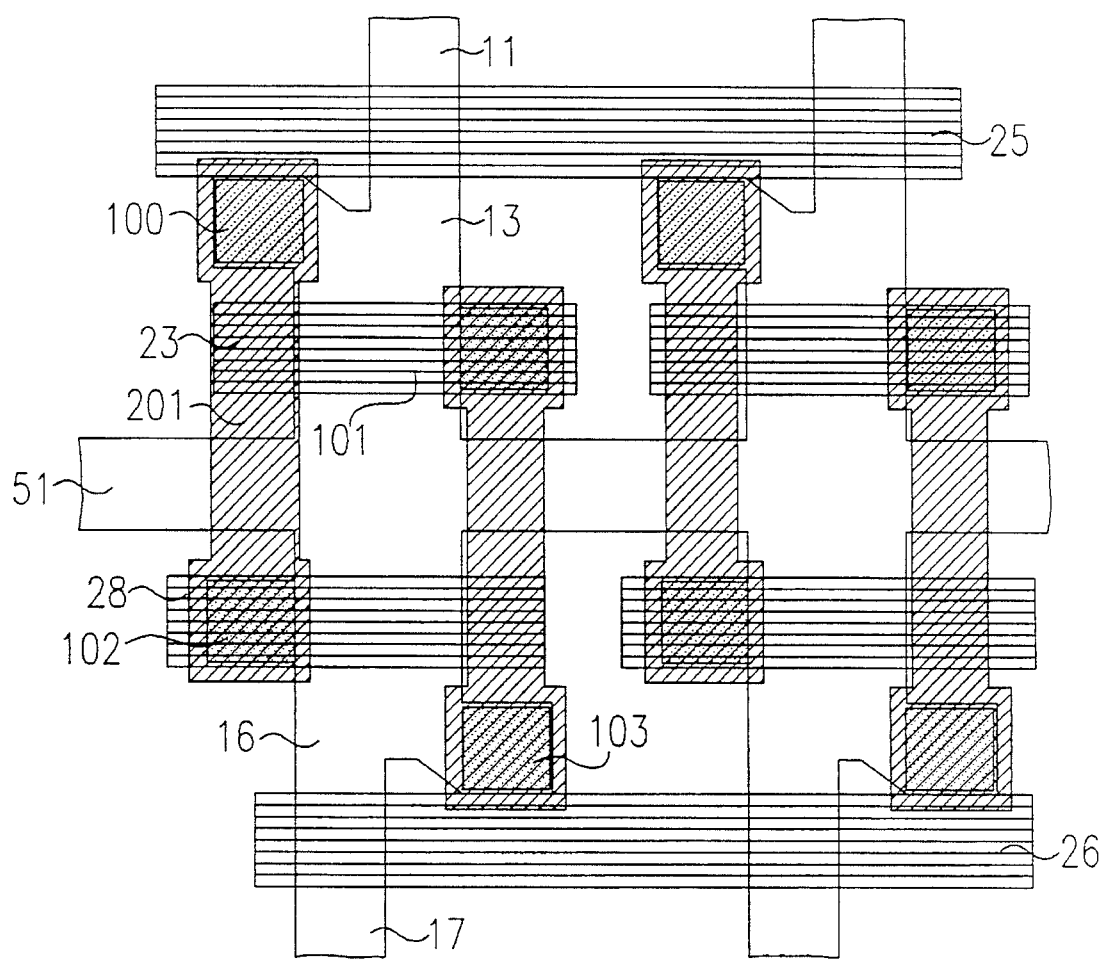

FIG. 4 illustrates a second polysilicon stripe 201 and 202. Polysilicon stripes 201 and 202 serve to form the gates 27 and 29 of thin film transistors in FIG. 1. Furthermore, stripe 201 serves to provide a local interconnect between node 13 and gate 28, while stripe 202 also provides a local interconnection between gate 23 and node 16. Polysilicon stripes 201 and 202 fill openings 100, 101, 102, and 103.

Figure 5:
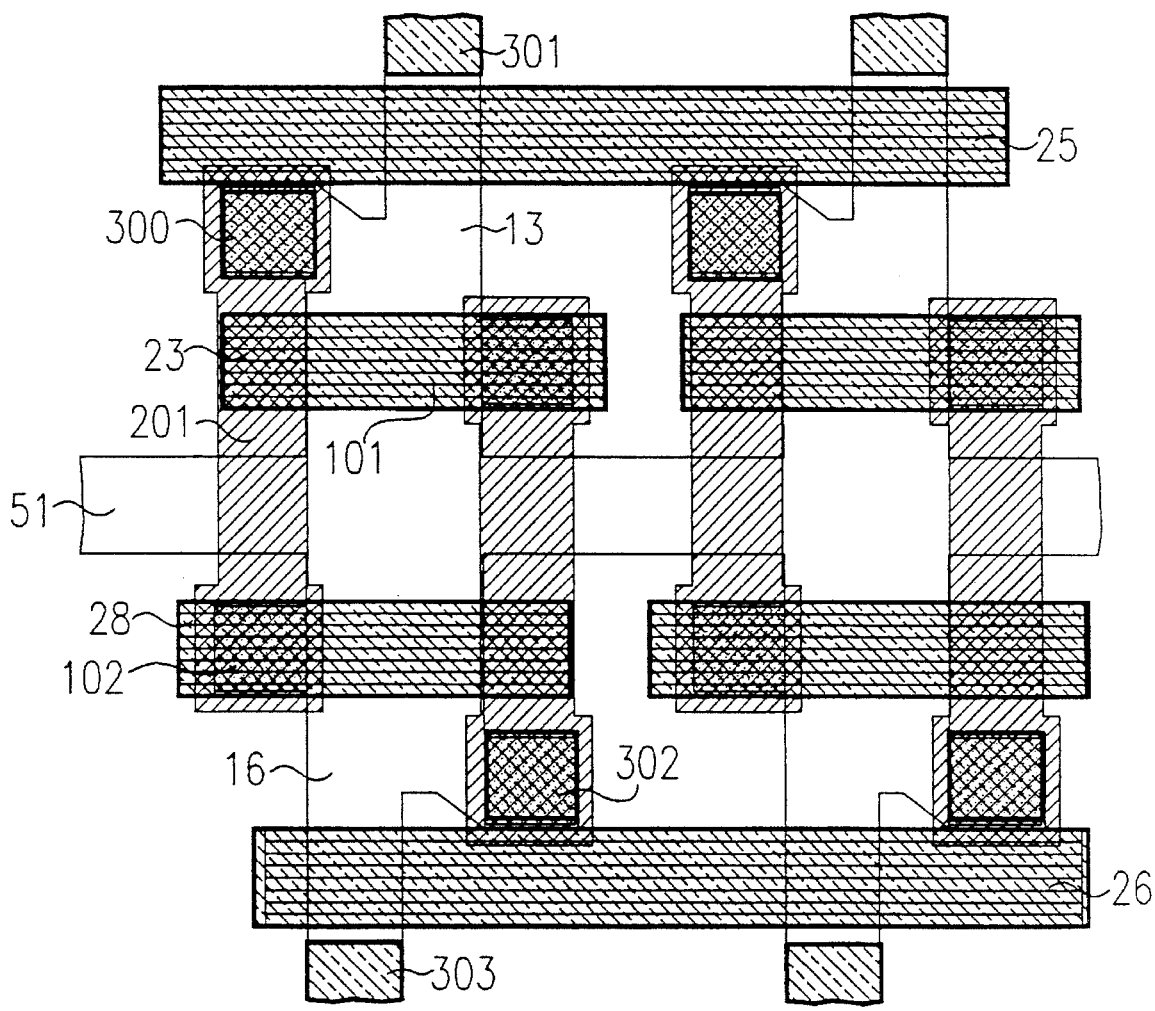
Figure 6:
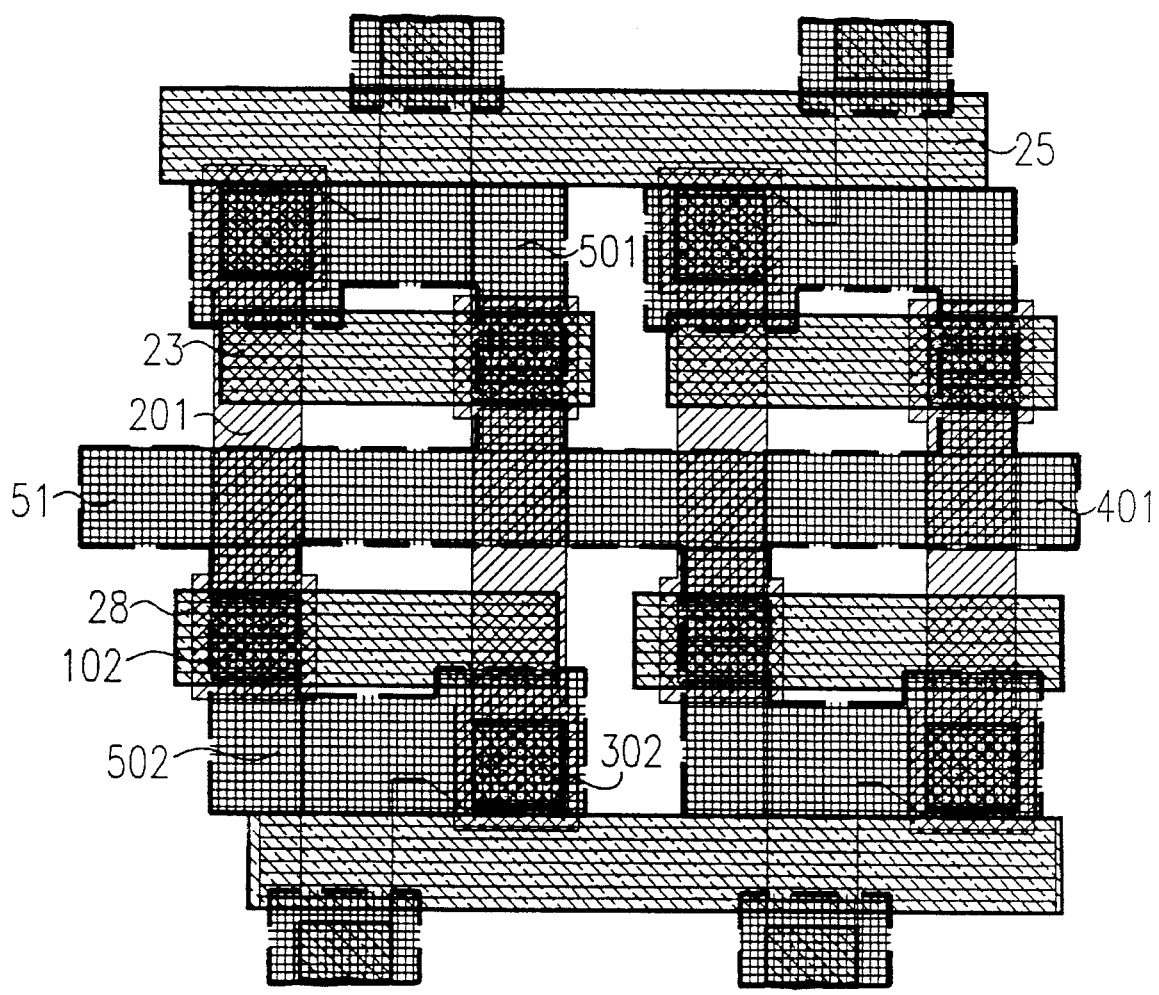

In FIG. 5, etched openings 300, 301,302, and 303 are denoted.

FIG. 7 illustrates the cell of FIG. 5 after a third polysilicon level is deposited. Polysilicon stripe 401 forms voltage line, $V_{ss}$, denoted by reference numeral 31 in FIG. 1. Furthermore, contiguous polysilicon stripes 501 and 502 also form the body of thin film transistors denoted in FIG. 1 by gates 27 and 29.

Completion of the cell is now within the purview of those skilled in the art, the remaining steps including source/drain implants for the thin film transistor and the deposition of appropriate metal lines.

We claim:

1. An SRAM semiconductor integrated circuit comprising:

a substrate having a doped region, said region having first and second electrically connected portions;

first and second gates overlying a substrate, said first gate having a first width and said second gate having a second width, both said first and second gate having their entire respective widths extending in the same direction, said gates defining between them a current path through said first portion of said substrate and not defining between them a current path through said second portion of said substrate;

a silicide covering said second portion of said substrate; a dielectric overlying said substrate and said gates, said dielectric having an opening exposing said silicide; and a resistive load material extending through said opening and directly contacting said silicide.

2. The integrated circuit of claim 1 in which said current path has a constant width.

3. The integrated circuit of claim 1 in which one of said gates comprises a portion of an access transistor, and the other of said gates comprises a portion of a pull down transistor.

\* \* \* \* \*